(12) United States Patent
Bertagnoll et al.

(10) Patent No.: US 6,750,095 B1
(45) Date of Patent: Jun. 15, 2004

(54) INTEGRATED CIRCUIT WITH VERTICAL TRANSISTORS

(75) Inventors: Emmerich Bertagnoll, Vienna (AT); Franz Hofmann, Munich (DE); Bernd Goebel, Dresden (DE); Wolfgang Roesner, Ottobrunn (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/787,966

(22) PCT Filed: Sep. 22, 1999

(86) PCT No.: PCT/DE99/03031

§ 371 (c)(1), (2), (4) Date: May 29, 2001

(87) PCT Pub. No.: WO00/19529

PCT Pub. Date: Apr. 6, 2000

(30) Foreign Application Priority Data

Sep. 25, 1998 (DE) .......................................... 198 44 083

(51) Int. Cl.[7] .......................................... H01L 21/8242
(52) U.S. Cl. .................. 438/242; 438/156; 438/173; 438/192; 438/206; 438/212; 438/268
(58) Field of Search ................................ 438/156, 173, 438/192, 206, 212, 231–232, 242, 245, 267–269, 291

(56) References Cited

U.S. PATENT DOCUMENTS

| | | | | |
|---|---|---|---|---|
| 4,630,088 A | | 12/1986 | Ogura et al. .............. 357/23.6 |
| 4,791,463 A | * | 12/1988 | Malhi ......................... 257/302 |
| 4,914,739 A | * | 4/1990 | Malhi ......................... 257/302 |
| 4,920,389 A | | 4/1990 | Itoh ............................ 357/23.6 |
| 4,939,104 A | * | 7/1990 | Pollack et al. ............... 438/561 |
| 4,967,247 A | * | 10/1990 | Kaga et al. .................. 257/311 |
| 5,001,526 A | * | 3/1991 | Gotou ......................... 257/302 |
| 5,010,386 A | * | 4/1991 | Groover, III ................ 257/369 |
| 5,181,089 A | * | 1/1993 | Matsuo et al. .............. 257/299 |
| 5,316,962 A | * | 5/1994 | Matsuo et al. .............. 438/245 |
| 5,559,353 A | * | 9/1996 | Risch et al. ................. 257/334 |
| 5,627,390 A | | 5/1997 | Maeda et al. ................ 257/302 |
| 6,172,391 B1 | * | 1/2001 | Goebel et al. .............. 257/305 |

FOREIGN PATENT DOCUMENTS

| | | | | |
|---|---|---|---|---|
| DE | 19617646 | | 11/1997 | ......... H01L/27/112 |
| DE | 19519160 | | 10/1998 | |
| JP | 04 025171 | | 1/1992 | ......... H01L/27/108 |

* cited by examiner

*Primary Examiner*—Hoai Ho
*Assistant Examiner*—Andy Huynh
(74) *Attorney, Agent, or Firm*—Fish & Richardson P.C.

(57) ABSTRACT

A method of producing an integrated circuit having a vertical MOS transistor includes doping a substrate to form a layer adjacent to its surface and forming a lower doped layer serving as the transistor's first source/drain region. The transistor's channel region is formed by doping a central layer above the lower layer. A second source/drain region is formed by doping an upper layer above the central layer. The upper, central and lower layers form a layer sequence having opposed first and second faces. A connecting structure is formed on the first face to electrically connect the channel region and the substrate. The connecting structure laterally adjoins at least the central layer and the lower layer, and extends into the substrate. A gate dielectric and adjacent gate electrode are formed on the second face.

10 Claims, 6 Drawing Sheets

INTEGRATED CIRCUIT WITH VERTICAL TRANSISTORS

FIELD OF INVENTION

The invention relates to an integrated circuit arrangement with at least one transistor and to a method for its production.

BACKGROUND

For an integrated circuit arrangement, that is to say an electronic circuit which is integrated in a substrate, a high packing density is advantageous since, firstly, its switching speed is high because of short distances between its components and, secondly, its dimensions are low.

L. Risch et al, Vertical MOS Transistors with 70 nm channel length, ESSDERC (1995) 101, describes a transistor whose source/drain regions and channel region are arranged under one another. This so-called vertical transistor takes up less area than a conventional planar transistor whose source/drain regions and channel region are arranged beside one another and, consequently, can contribute to increasing the packing density of an integrated circuit arrangement. It is feared, however, that in the case of this transistor, floating-body effects occur, such as leakage currents on account of a parasitic bipolar transistor. In particular, at high frequencies, it is probable that the channel region will be electrically charged.

H. Takato et al, "High Performance CMOS Surrounding Gate Transistor (SGT) for Ultra High Density LSIs", IEDM (1988) 222, describes a vertical transistor in which a lower source/drain region is not arranged directly under a channel region but underneath but offset laterally in relation to the former. The channel region is electrically connected to the substrate. In order to produce the transistor, a silicon island is etched into a substrate. A gate dielectric and a spacer-like gate electrode, which surrounds the silicon island at the side, are then produced. By means of implantation, the upper source/drain region is produced in an upper part of the silicon island, and the lower source/drain region is produced outside and laterally adjacent to the silicon island. The channel region is arranged in the silicon island, underneath the upper source/drain region. Consequently, the channel length is determined by the etching depth during the production of the silicon island.

German patent 195 19 160 C1 has proposed a DRAM cell arrangement in which each memory cell comprises a projection-like semiconductor structure which comprises a first source/drain region, a channel region arranged underneath, and a second source/drain region arranged under the latter, and which is surrounded annularly by a gate electrode. Semiconductor structures of memory cells are arranged in rows and columns. In order to produce word lines in a self-adjusting manner, that is to say without the use of masks which have to be adjusted, spacings between semiconductor structures arranged along the columns are smaller than spacings between semiconductor structures arranged along the rows. The word lines are produced by depositing and etching back conductive material in the form of gate electrodes adjoining one another along the columns.

SUMMARY

The invention is based on the object of specifying an integrated circuit arrangement having at least one transistor in which floating-body effects in the transistor can be avoided and which, at the same time, can be produced with an increased packing density and process accuracy in comparison with the prior art. In addition, a method of producing such a circuit arrangement is specified.

The problem is solved by an integrated circuit arrangement having at least one vertical MOS transistor, for which a substrate is provided which, in a layer adjacent to a surface of the substrate, is doped with a first conductivity type. Arranged on the substrate is a structured sequence of layers having a lower layer, a central layer doped with the first conductivity type and an upper layer. The sequence of layers has at least one first lateral and a second lateral face, which are each formed by the lower layer, the central layer and the upper layer. The lower layer can be used as a first source/drain region of the transistor, the central layer can be used as a channel region of the transistor, and the upper layer can be used as a second source/drain region of the transistor. In order to connect the channel region electrically to the substrate, a connecting structure doped with the first conductivity type is arranged on at least the first face of the sequence of layers in such a way that it laterally adjoins at least the central layer and the lower layer and reaches into the substrate. A gate dielectric adjoins at least the second face of the sequence of layers, and a gate electrode of the transistor adjoins the gate dielectric.

The problem is further solved by a method of producing an integrated circuit arrangement having at least one vertical MOS transistor in which, in order to form a sequence of layers on a substrate which is doped with a first conductivity type in a layer adjacent to a surface of the substrate, firstly a lower doped layer is produced, which can be used as a first source/drain region of the transistor, above this a central layer doped with the first conductivity type is produced, which can be used as the channel region of the transistor, and above that a doped upper layer is produced, which can be used as a second source/drain region of the transistor. In order to connect the channel region electrically to the substrate, a connecting structure doped with the first conductivity type is produced on a first face of the sequence of layers in such a way that it laterally adjoins at least the central layer and the lower layer and reaches into the substrate. The sequence of layers is structured in such a way that a second face of the sequence of layers is produced opposite the first face. A gate dielectric and, adjacent thereto, a gate electrode are produced at least on the second face of the sequence of layers.

The channel length of the transistor of the circuit arrangement is determined by the thickness of the central layer. As compared with the transistor according to H. Takato et al (see above), in which the channel length is determined by an etching depth, the channel length can be set more accurately. Consequently, the circuit arrangement can be produced with an increased process accuracy.

The connecting structure permits charge to flow away from the channel region, so that, as opposed to the transistor according to Risch et al (see above), floating-body effects are avoided. The channel region is not charged up electrically, even at high frequencies.

In order to avoid leakage currents, the connecting structure preferably consists of monocrystalline semiconductor material, such as silicon and/or germanium. The connecting structure is produced, for example, by epitaxy in a trench which cuts into or cuts through the sequence of layers. It is advantageous to provide a low dopant concentration, for example up to $3*10^{17}$ cm$^{-3}$, of the connecting structure, in order to keep capacitances between the substrate and the gate electrode small.

Alternatively, polycrystalline semiconductor material, such as polysilicon, can be used for the connecting structure. In this case, the trench is filled with the semiconductor material. Alternatively, the semiconductor material can be applied in a thickness which is not sufficient to fill the trench. The semiconductor material can then be etched back, so that the connecting structure is produced in the form of a spacer. If the connecting structure comprises polycrystalline material or material with a large number of defects, it is advantageous to provide a high dopant concentration of the connecting structure, for example $5*10^{18}$ $cm^{-3}$ to $10^{20}$ $cm^{-3}$, in order to reduce the expansion of space charge zones into the connecting structure.

In order to increase breakdown voltages between the connecting structure and the source/drain regions and, at the same time, to prevent space charge zones reaching through, the scope of the invention includes increasing the dopant concentration of the connecting structures during their production, so that inner parts of the connecting structures are more highly doped than outer parts.

A particularly high packing density of the circuit arrangement may be achieved if a width of the connecting structure and/or a spacing between the first face and the second face of the sequence of layers, which lies opposite the first face, are smaller than the minimum structure size F that can be produced in the photolithography applied for the production of the circuit arrangement.

In order to produce such a narrow sequence of layers, a spacer can be used as a mask.

Since the connecting structure is produced on the first face of the sequence of layers, and the gate dielectric is produced on the second face of the sequence of layers, and therefore the two faces are subjected to different process steps, it is advantageous if the sequence of layers is produced in two different process steps. For this purpose, a mask is applied to the surface, said mask leaving at least an area of $F^2$, of the upper layer free. The mask is widened by a spacer in that material is deposited and etched back. As a result, the exposed area of the upper layer is reduced to sub-lithographic dimensions. In order to produce the trench and therefore the first face of the sequence of layers, the exposed area of the upper layer is subjected to a first etching process, etching being carried out selectively in relation to the spacer and the mask. The connecting structure is then produced. The mask is removed selectively in relation to the spacer. By means of a second etching process, the second face of the sequence of layers is produced, etching being carried out selectively in relation to the spacer.

If the connecting structure consists of the same semiconductor material as the output layer, the central layer or the lower layer, then an auxiliary structure is produced above the connecting structure, in order to protect the connecting structure during the production of the second face of the sequence of layers. If an upper face of the connecting structure is located under an upper face of the mask, then the auxiliary structure can be produced by a material being deposited and planarized until the mask is exposed.

The circuit arrangement can have a further sequence of layers, constructed analogously to the sequence of layers, whose first face adjoins the connecting structure in such a way that the connecting structure is arranged between the sequence of layers and the further sequence of layers, and a central layer of the further sequence of layers is electrically connected to the substrate. A further gate dielectric adjoins at least a second face of the further sequence of layers, and a further gate electrode adjoins the further gate dielectric.

In order to simplify the process, the sequence of layers and the further sequence of layers are preferably produced by structuring a single upper layer, central layer and lower layer. Alternatively, the sequences of layers are produced, for example, by selective epitaxy within a suitable mask.

In the following text, the description "upper layer" is used for the continuous upper layer which is produced at the beginning of the production method and from which parts of the sequence of layers are produced. This is similarly true of the "central layer" and the "lower layer". On the other hand, "the upper layer of the sequence of layers" describes only a specific part of this sequence of layers. If the sequences of layers are produced from the upper layer, then "the upper layer of the sequence of layers" means the same as "that part of the upper layer belonging to the sequence of layers".

If the upper layer of the sequence of layers and an upper layer of the further sequence of layers are used as the second source/drain region of the transistor, the central layer of the sequence of layers and the central layer of the further sequence of layers are used as the channel region of the transistor, and the lower layer of the sequence of layers and a lower layer of the further sequence of layers are used as the first source/drain region of the transistor, then the transistor has a particularly large channel width. The gate electrode and the further gate electrode form a common gate electrode.

The upper layer, the central layer and the lower layer can be structured in such a way that they surround the connecting structure, so that the sequence of layers and the further sequence of layers merge into each other. The sequence of layers and the further sequence of layers can alternatively be separated by the connecting structure. In the first case, the mask leaves an area, for example a square area, free, so that an intrinsically closed spacer is formed during the widening of the mask, and therefore a correspondingly structured sequence of layers can be produced. In the second case, the mask is strip-like, for example, so that two spacers separated from each other, and therefore two sequences of layers separated from each other, are produced.

A region doped with a second conductivity type opposite to the first conductivity type can be arranged above the connecting structure, in order to connect the upper layer of the sequence of layers and the upper layer of the further sequence of layers electrically to each other.

In order to produce the doped region, an upper part of the connecting structure can be implanted, so that the aforesaid upper part is converted into the doped region.

If the upper layer of the further sequence of layers is used as a second source/drain region of a further transistor, the central layer of the further sequence of layers is used as a channel region of the further transistor, and the lower layer of the further sequence of layers is used as a first source/drain region of the further transistor, then the packing density of the circuit arrangement is particularly high, since the connecting structure acts, firstly, as a common connecting structure of the two sequences of layers and, secondly, separates the transistors from each other. Here, too, the doped region can be provided, so that the two transistors are connected in series.

The circuit arrangement can be used, for example, as a memory cell arrangement. The sequence of layers and the further sequence of layers form a pair, the second face of the sequence of layers being opposite the first face of the sequence of layers, and the first face of the further sequence of layers being opposite the first face of the sequence of layers. A number of pairs analogous to the pair are arranged in an xy grid. At least some of the pairs are separated from each another by first dividing trenches running substantially parallel to one another, so that alternately one of the pairs and one of the first dividing trenches are arranged beside each other, and the second faces of the sequences of layers of the pairs adjoin the first dividing trenches. Word lines, which run transversely with respect to the first dividing trenches, are connected to the gate electrode. Lower bit lines are preferably parts of the lower layer and run transversely with respect to the word lines. The trenches in which the connecting structures belonging to the pairs are produced are produced in the form of strips. The first dividing trenches run parallel to the trenches. The lower layer is structured at least by the trenches, so that the lower bit lines adjoin the connecting structures and run parallel to them.

If the first dividing trenches are produced in such a way that they reach down into the lower layer without cutting through them, alternately one of the lower bit lines and one of the trenches are arranged beside each other. Such a circuit arrangement can be used, for example, as a ROM cell arrangement. Pairs which are arranged between two of the first dividing trenches which are adjacent to each other merge into each other, so that the associated connecting structures form a common connecting structure which has cross sections parallel to the surface which are strip-like and run substantially parallel to the first dividing trenches. This applies similarly to the doped regions which form upper bit lines. The gate electrodes are parts of the word lines which have strip-like cross sections parallel to the surface. Each pair is part of two transistors which are connected in series and which are each connected between one of the upper bit lines and one of the lower bit lines. A memory cell comprises one transistor. The memory cell can be produced with an area of $2F^2$. Information is stored in the form of dopant concentrations of the channel regions and therefore in the form of threshold voltages of the transistors. In order to read the information out of a transistor, the associated word line is activated and a measurement is made to see whether or not a current flows between the associated upper bit line and the associated lower bit line. The dopant concentrations of the channel regions of the transistors can be adjusted by means of masked, oblique implantation.

If the first dividing trenches are produced in such a way that they cut through the lower layer, then one of the lower bit lines is arranged between one of the trenches and one of the first dividing trenches. Such a circuit arrangement can be used, for example, as a DRAM cell arrangement. It is also advantageous in this memory-cell arrangement if connecting structures of pairs which are arranged between two mutually adjacent first dividing trenches form a common connecting structure. The connecting structure has a cross section which is parallel to the surface, is strip-like and runs parallel to the first dividing trenches. In the case of the DRAM cell arrangement, however, the pairs which are arranged between two of the first dividing trenches which are adjacent to each other do not merge into each other but are separated from each other by second dividing trenches. The second dividing trenches run transversely with respect to the first dividing trenches and reach down into the lower layer. The second dividing trenches do not cut through the lower layer, in order that the lower bit lines are not interrupted. In addition, the connecting structures are not interrupted by the second dividing trenches.

It is within the scope of the invention if in each case one of the pairs is part of one of the transistors. In this case, it is advantageous to provide the doped regions which connect the upper layers of the sequences of layers of the pair to each other. The transistor is connected to two lower bit lines, which adjoin the associated connecting structure. The two lower bit lines are connected together, for example in a periphery of the DRAM cell arrangement, and act as a single bit line.

It is within the scope of the invention if the upper layers and the doped regions act as first capacitor electrodes of capacitors. For this purpose, a capacitor dielectric is arranged above the upper layers and the doped regions and, above this, a second capacitor electrode, which can be designed as a common capacitor plate of all the capacitors.

As opposed to the ROM cell arrangement, in which the word lines run above the upper layers, the word lines of the DRAM cell arrangement are preferably configured in a different way, since they otherwise run above the capacitors which are arranged above the upper layers. The word lines are, for example, formed by the gate electrodes, which surround the pairs annularly at the sides and adjoin one another within the first dividing trenches.

A memory cell of the DRAM cell arrangement comprises one of the transistors and one of the capacitors, which are connected in series with each other. The memory cell can be produced with an area of $4F^2$.

The information in a memory cell is stored in the form of a charge on the associated capacitor.

In order to increase the packing density, it is within the scope of the invention if in each case one of the pairs is part of two transistors. In this case, the doped regions are not provided, in order that the transistors are separated from each other. The lower bit lines act as individual bit lines. A memory cell in such a DRAM cell arrangement can have an area of only $2F^2$.

A FRAM (ferroelectric RAM) cell arrangement is produced if the capacitor dielectric contains a ferroelectric material.

The mask for producing the sequences of layers and the connecting structures can comprise a first auxiliary layer and a second auxiliary layer arranged above the first, it being possible for the first auxiliary layer to be etched selectively in relation to the spacer, and for the second auxiliary layer to be etched selectively in relation to the semiconductor material.

In order to produce the memory cell arrangements, the first auxiliary layer and the second auxiliary layer are structured in a strip-like manner, so that the upper layer is partially exposed. During the production of the trenches, the second auxiliary layer and the spacers act as a mask. During the production of the auxiliary structures, the second auxiliary layer and the spacers are removed until the first auxiliary layer is exposed. The first auxiliary layer is then removed selectively in relation to the spacers and auxiliary structures, so that the spacers and the auxiliary structures can act as a mask during the production of the first dividing trenches.

In order to protect the upper layer, a protective layer can be produced between the upper layer and the first auxiliary layer. The protective layer, the second auxiliary layer, the spacers and the auxiliary structures can contain $SiO_2$, for example. The first auxiliary layer can contain polysilicon, for example.

The word lines of the DRAM cell arrangement can be produced in a self-adjusting is manner, that is to say without the use of masks to be adjusted, if spacings between pairs which are adjacent to each other transversely with respect to the first dividing trenches are smaller than spacings between pairs which are adjacent to each other parallel to the first dividing trenches. In this case, in order to produce the word lines, material can be deposited in such a thickness that the first dividing trenches are filled but not the second dividing trenches. By means of etching back, spacers are then produced in the second dividing trenches, while bottoms of the first dividing trenches continue to remain caboveed by material. As a result, therefore, the gate electrodes are produced without masks, surround the pairs annularly and adjoin one another within the first trenches.

In order to implement the spacings of different sizes at a high packing density, following the removal of the first auxiliary layer, further spacers adjacent to the spacers can be produced by material being deposited and etched back. The further spacers preferably consist of the same material as the spacers. The first dividing trenches are produced, the spacers, the further spacers and the auxiliary structures acting as a mask. The first dividing trenches produced in this way are narrower than the first dividing trenches of the above-described ROM cell arrangement. The second dividing trenches can be produced with a lithographically structured mask, so that their widths are considerably greater than the widths of the first dividing trenches and, for example, are of a size F.

In the following text, exemplary embodiments of the invention, which are illustrated in the figures, will be explained in more detail.

BRIEF DESCRIPTION OF THE DRAWINGS

FIG. 6b shows a cross section, perpendicular to the cross section from FIG. 6a, through the second substrate, after the process steps from FIG. 6a.

FIG. 7b shows the cross section of FIG. 6b after the process steps of FIG. 7a.

DETAILED DESCRIPTION

In a first exemplary embodiment, use is made of 250 nm technology, that is to say the minimum structure size F which can be produced by photolithography is 250 nm. Provided as a starting material is a first substrate 1 which, in a layer adjacent to a surface of the first substrate 1, is p-doped with a dopant concentration of about $10^{17}$ cm$^{-3}$. By means of in-situ doped epitaxy, an n-doped lower layer U about 500 nm thick is produced. The dopant concentration of the lower layer U is about $10^{20}$ cm$^{-3}$. A p-doped central layer M about 200 nm thick is produced on the lower layer U by means of in-situ doped epitaxy. The dopant concentration of the central layer M is about $3\times10^{17}$ cm$^{-3}$. An n-doped upper layer O, whose dopant concentration is about $10^{21}$ cm$^{-3}$ and which is about 200 nm thick is then produced on the central layer M by means of in-situ doped epitaxy (see FIG. 1). In order to produce a protective layer S, SiO$_2$ is deposited in a thickness of about 50 nm in a TEOS process. Over this, a first auxiliary layer H1 is produced by depositing polysilicon in a thickness of about 200 nm. Over the first auxiliary layer H1, a second auxiliary layer H2 is produced by depositing SiO$_2$ in a thickness of about 100 nm (see FIG. 1).

By means of a photolithographic process, the protective layer S, the first auxiliary layer H1 and the second auxiliary layer H2 are structured to form a strip-like mask. The strips of the mask are about 250 nm wide and have a spacing from each other of about 250 nm. Suitable etchants during the structuring are, for example, CHF$_3$+O$_2$ and C$_2$F$_6$+O$_2$.

In order to produce spacers Sp on areas of the mask, SiO$_2$ is deposited in a thickness of about 80 nm and etched back with CHF$_3$+O$_2$. As a result, the mask is widened by the spacers Sp (see FIG. 1).

Figure 1:
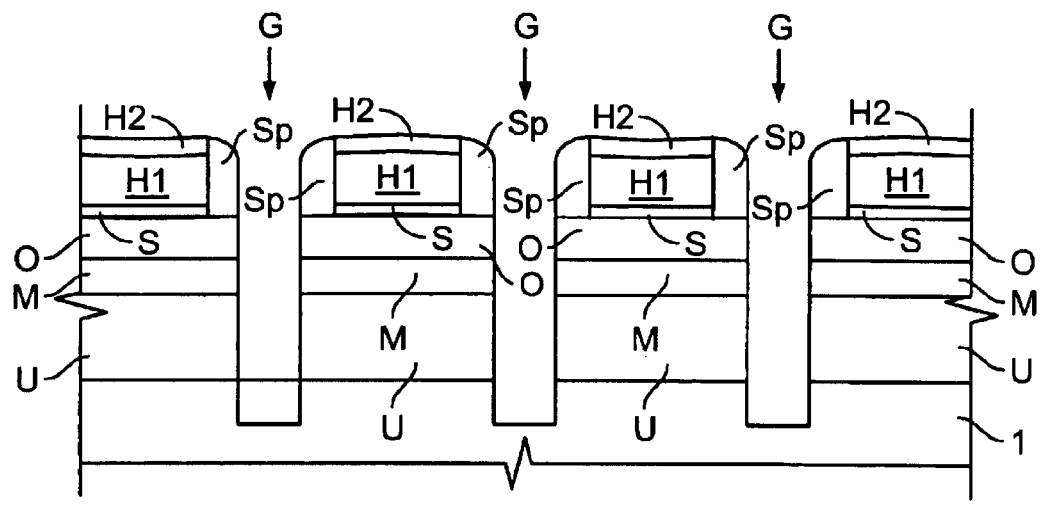
FIG. 1 shows a cross section through a first substrate after a lower layer, a central layer, an upper layer, a protective layer, a first auxiliary layer, a second auxiliary layer, spacers and trenches have been produced.

With the aid of the mask widened by the spacers Sp, silicon is etched selectively to SiO$_2$ about 1.1 μm deep by using, for example, HBr+NF$_3$+He+O$_2$, so that trenches G parallel to the strips of the mask are produced (see FIG. 1).

Figure 2:
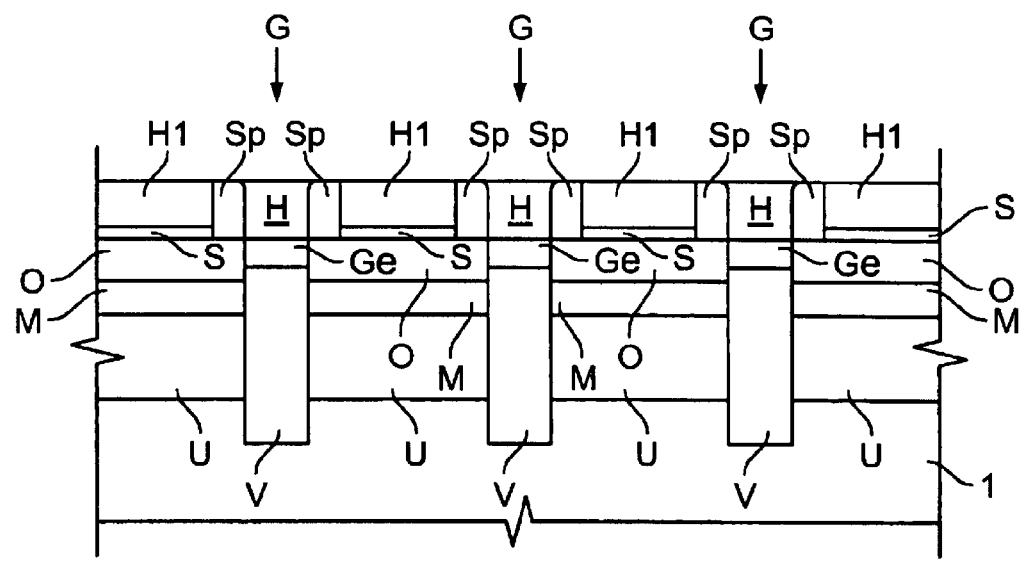
FIG. 2 shows the cross section of FIG. 1 after connecting structures, doped regions and auxiliary structures have been produced and the second auxiliary layer has been removed.

In the trenches G, by means of selective epitaxy with a dopant concentration of $3\times10^{17}$ cm$^{-3}$, p-doped connecting structures V are produced, which connect the central layer M electrically to the first substrate 1 (see FIG. 2). An upper face of the connecting structure V is located approximately at the same height as an upper face of the upper layer O. The connecting structures V have a width of about 90 nm. The width of the connecting structures V is therefore sublithographic. Mutually adjacent connecting structures V have a spacing from each other of about 410 nm.

By means of implantation with n-doped ions, n-doped regions Ge whose dopant concentration is about $5\times10^{20}$ cm$^{-3}$ are produced in upper parts of the connecting structures V (see FIG. 2).

Then, SiO$_2$ is deposited in a thickness of about 300 nm and chemically-mechanically polished. In the process, the second auxiliary layer H2 is removed and part of the spacers Sp is removed. Auxiliary structures H made of SiO$_2$ are produced above the doped regions Ge (see FIG. 2).

The first auxiliary layer H1 is removed by polysilicon being etched selectively in relation to SiO$_2$ by using, for example, C$_2$F$_5$+O$_2$, so that the spacers Sp and the auxiliary structures H act as a mask. SiO$_2$ is then etched about 50 nm deep with CHF$_3$+O$_2$, SO that the protective layer S is removed and the upper layer O is partially exposed.

In order to produce dividing trenches T, silicon is etched, for example with HBr+NF$_3$+He+O$_2$, the auxiliary structures H and the spacers Sp acting as a mask. The dividing trenches T are about 600 nm deep and reach down into the lower layer U without cutting through it (see FIG. 3). In the process, sequences of layers SF, SF* are produced from the upper layer O, the central layer M and the lower layer U', the sequences of layers adjoining the connecting structures V at first faces and adjoining the dividing trenches T at second faces. A spacing between the first face and the second face of a sequence of layers SF, SF* is about 80 nm and is therefore sub-lithographic. The dividing trenches T are produced in a self-adjusting manner in relation to the trenches G. The spacers Sp and the auxiliary structures H are then removed by etching $SiO_2$ selectively in relation to silicon.

Figure 3:
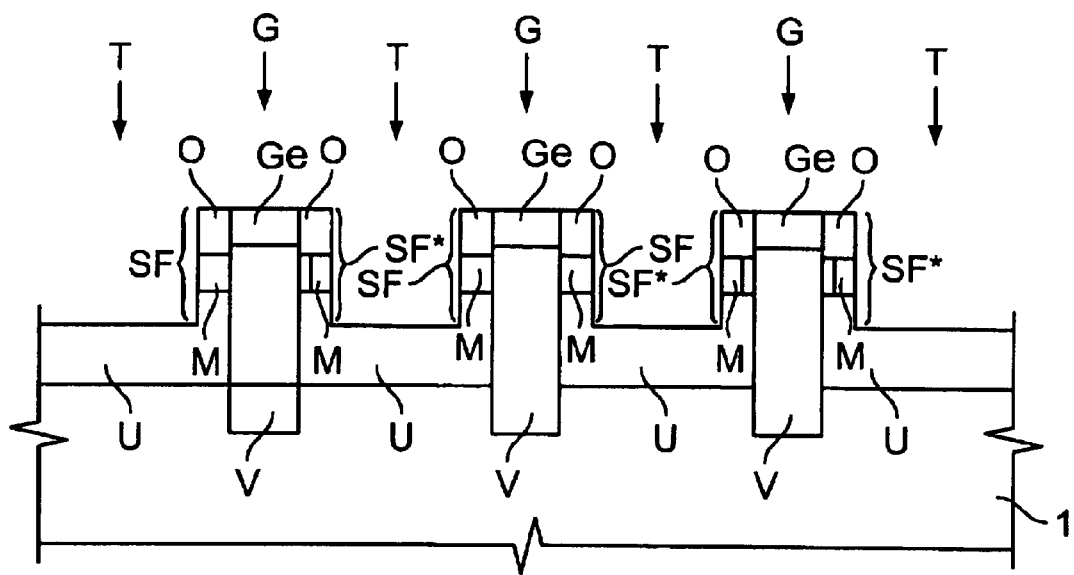
FIG. 3 shows the cross section of FIG. 2 after the first auxiliary layer, the protective layer, the spacers and the auxiliary structures have been removed, and dividing trenches and sequences of layers of transistors have been produced.

By means of masked, oblique implantation with p-doped ions, selected sequences of layers SF* are implanted in such a way that the dopant concentration of the associated parts C of the central layer M rises to about $10^{19}$ cm$^{-3}$ (see FIG. 3).

Figure 4A:
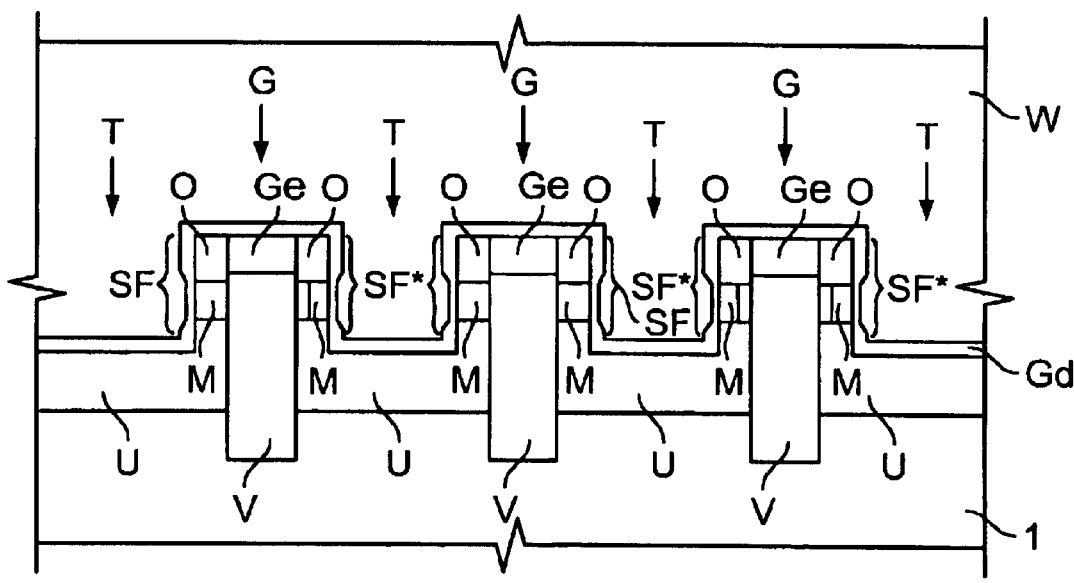
FIG. 4a shows the cross section from FIG. 3 after a gate dielectric and word lines have been produced.

A gate dielectric Gd about 5 nm thick is produced by thermal oxidation (see FIG. 4a).

Figure 4B:
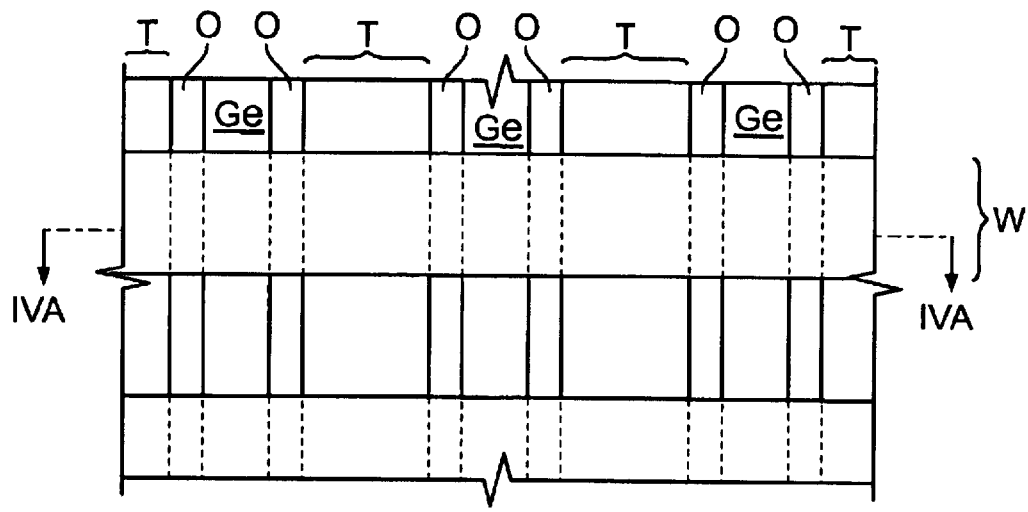
FIG. 4b shows a plan view of the first substrate, in which the upper layer, the doped regions, the dividing trenches and the word lines are shown.

In order to produce word lines W, in-situ n-doped polysilicon is deposited in a thickness of about 200 nm and structured in a strip-like manner by a photolithographic process (see FIGS. 4a and 4b).

The word lines W run transversely with respect to the trenches G. Parts of the word lines W which are located in the dividing trenches T can be used as gate electrodes of vertical transistors. Cross sections through the word lines W which are parallel to the surface and run above the upper layer O are strip-like. The structured lower layer U acts as lower bit lines and as source/drain regions of the transistors. The lower bit lines and the connecting structures V are alternately arranged beside one another. The central layer M acts as channel regions of the transistors. The upper layer O and the doped regions Ge act as further source/drain regions of the transistors and upper bit lines, which are strip-like and run parallel to the lower bit lines. Each sequence of layers SF, SF* is part of one of the transistors. The transistors are connected in series with one another in the word-line direction. The transistors are in each case connected between one of the upper bit lines and one of the lower bit lines. The circuit arrangement produced is suitable as a ROM cell arrangement. A memory cell comprises one of the transistors. The space requirement per memory cell is only $2F^2$.

In order to read the information out of a transistor, the associated word line W is activated and a check is made as to whether or not a current flows between the upper bit line and the lower bit line, between which the transistor is connected. If the part of the central layer M which belongs to the associated sequence of layers SF* was obliquely implanted, then no current flows, on account of the higher threshold voltage of this transistor. If the part of the central layer M which belongs to the associated sequence of layers SF was not obliquely implanted, then a current flows. The information is accordingly stored in the form of dopant concentrations of the channel regions of the transistors.

In a second exemplary embodiment, the 250 nm technology is likewise used. The starting material provided is a second substrate 2 made of silicon which, in a manner similar to the first exemplary embodiment, is p-doped in a layer adjacent to a surface.

Figure 5:
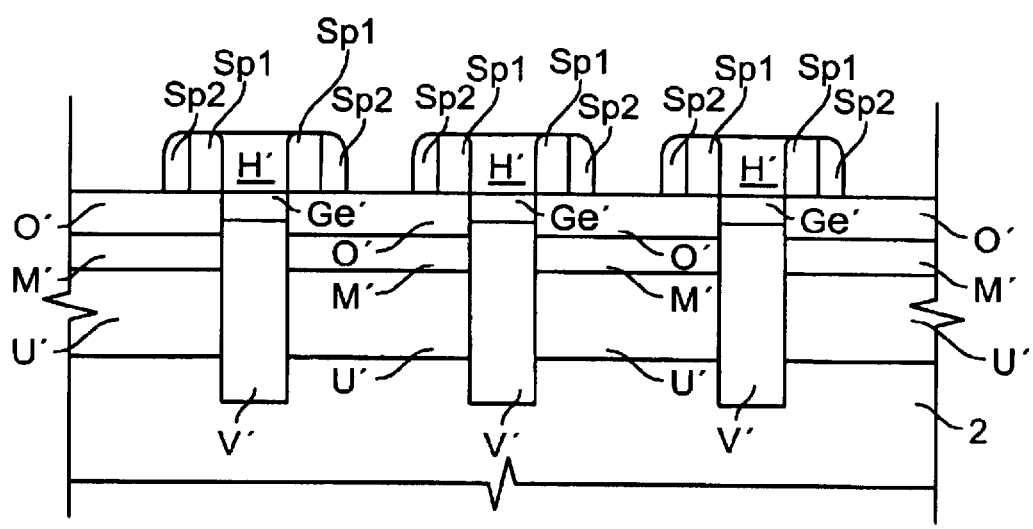
FIG. 5 shows a cross section through a second substrate after a lower layer, a central layer, an upper layer, spacers, connecting structures, doped regions, auxiliary structures and further spacers have been produced.

In a similar way to that in the first exemplary embodiment, a lower layer U', a central layer M', an upper layer O', spacers Sp1', connecting structures V', doped regions Ge' and auxiliary structures H' are produced (see FIG. 5). In order to produce further spacers Sp2, which adjoin the first spacers Sp1, $SiO_2$ is deposited in a thickness of about 80 nm and etched back with $CH_3+O_2$ (see FIG. 5). As a result, an exposed area of the upper layer O' becomes smaller.

Figure 6A:
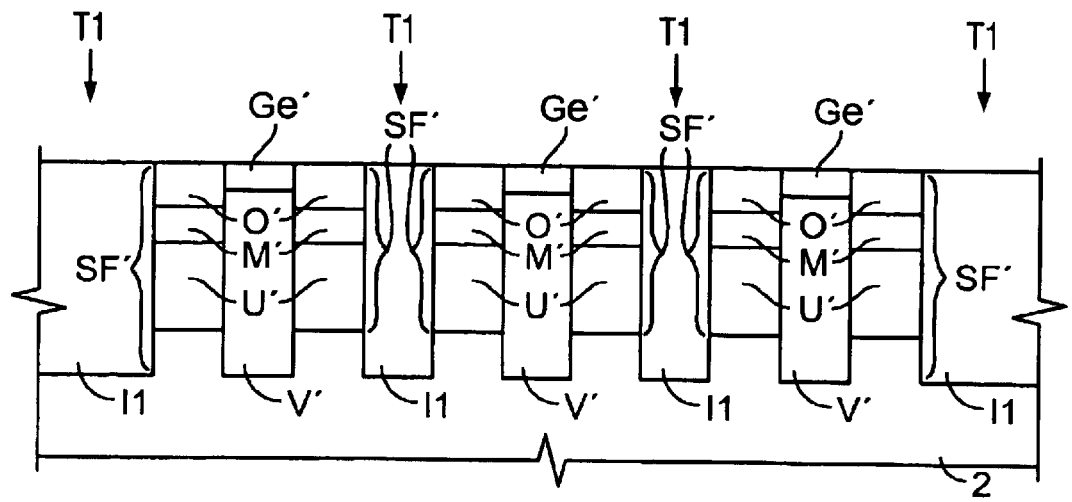
FIG. 6a shows the cross section of FIG. 5 after first dividing trenches, second dividing trenches and sequences of layers of transistors have been produced.

By etching silicon selectively in relation to $SiO_2$, first dividing trenches T1 about 1.1 μm deep are produced and cut through the lower layer U', the spacers Sp1, the further spacers Sp2 and the auxiliary structures H' being used as a mask (see FIG. 6a). In order to produce first insulating structures I1, SiO2 is deposited in a thickness of about 300 nm and planarized by chemical mechanical polishing until the upper layer O' is exposed (see FIG. 6a). In the process, the spacers Sp1, the further spacers Sp2 and the auxiliary structures H' are removed.

Figure 6B:
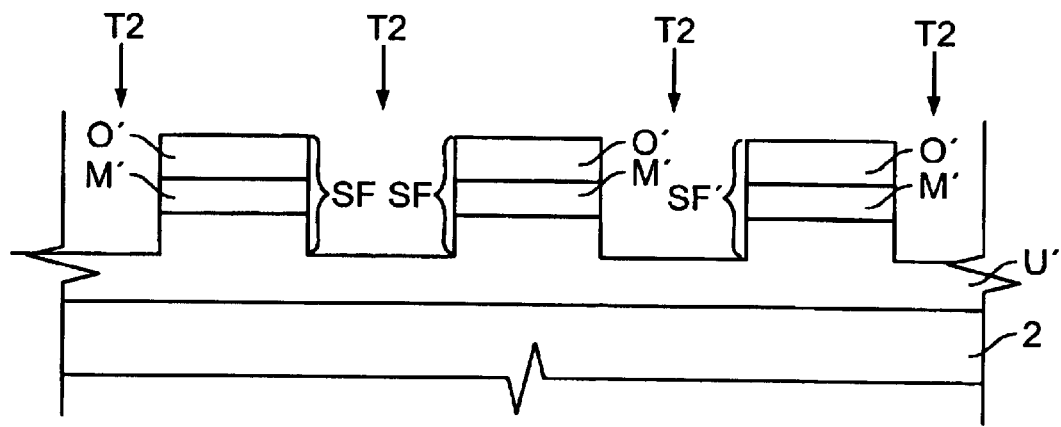
Figure 6C:
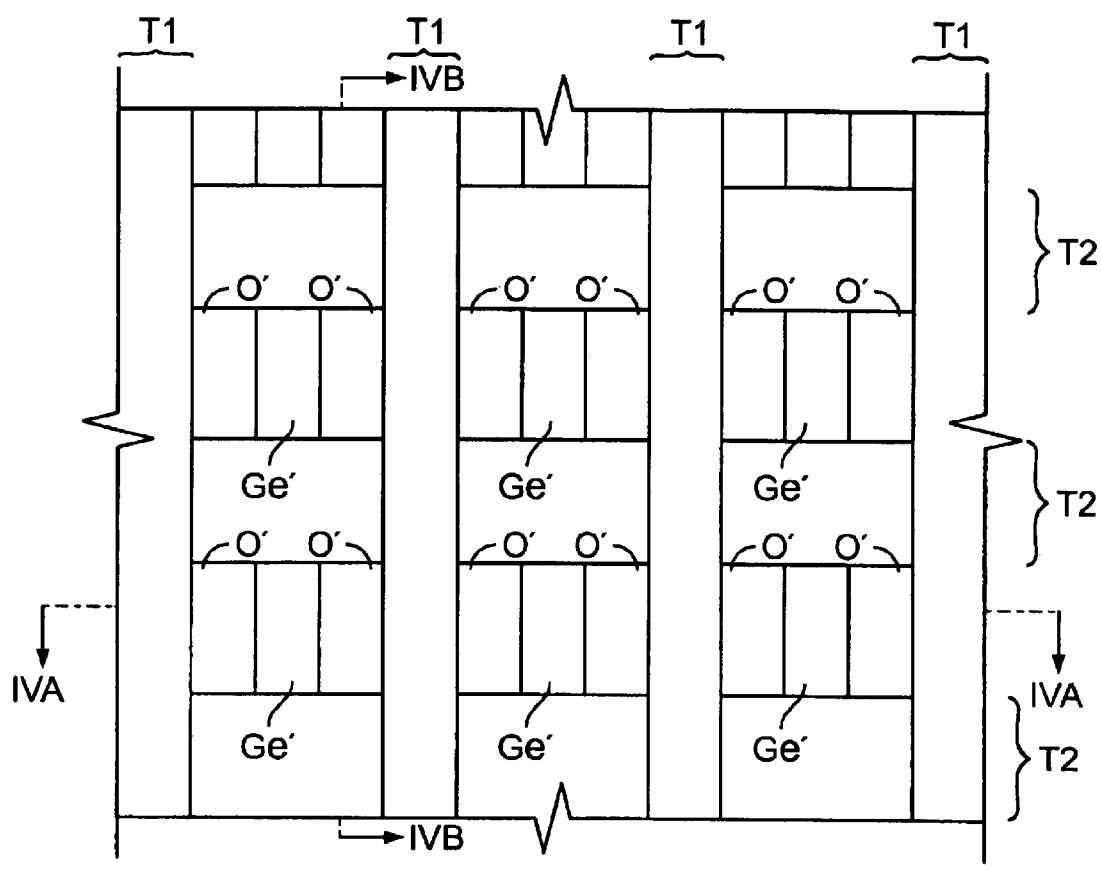
FIG. 6c shows a plan view of the second substrate, in which the upper layer, the doped regions, the first dividing trenches and the second dividing trenches are shown.

With the aid of a strip-like photoresist mask (not illustrated), whose strips are about 250 nm wide, have a spacing from one another of about 250 nm and run transversely with respect to the trenches G', second dividing trenches T2 are produced, which reach down into the lower layer U1 without cutting through them. The second dividing trenches T2 cross the first dividing trenches T1 and are about 600 nm deep outside the first dividing trenches T1. A suitable etchant here is $HBr+NF_3+He+O_2$ (see FIGS. 6b and 6c).

Sequences of layers SAF' are produced from the upper layer O', the central layer M' and the lower layer U' and are separated from one another by the connecting structures V', the first insulating structures I1 and the second dividing trenches T2.

Mutually adjacent sequences of layers SAF' which are separated from one another by one of the connecting structures V' have a spacing from one another of about 90 nm, while mutually adjacent sequences of layers SAF' which are separated from one another by one of the two dividing trenches T2' have a spacing from one another of about 250 nm.

In order to produce second insulating structures I2 in the second dividing trenches T2, $SiO_2$ is deposited in a thickness of about 300 nm and planarized by chemical mechanical polishing until the upper layer O' is exposed. $SiO_2$ is then etched back, so that upper faces of the first insulating structures I1 and of the second insulating structures I2 are about 500 nm underneath the surface of the substrate 2. The first insulating structures I1 therefore have a thickness of about 600 nm, and the second insulating structures I2 have a thickness of about 100 nm. This process step ensures that, within the first dividing trenches T1 and the second dividing trenches T2, a grid-like, flat base of $SiO_2$ is produced. By means of the flat base, the formation of undesired conductive spacers between adjacent word lines W' is avoided.

Figure 7A:
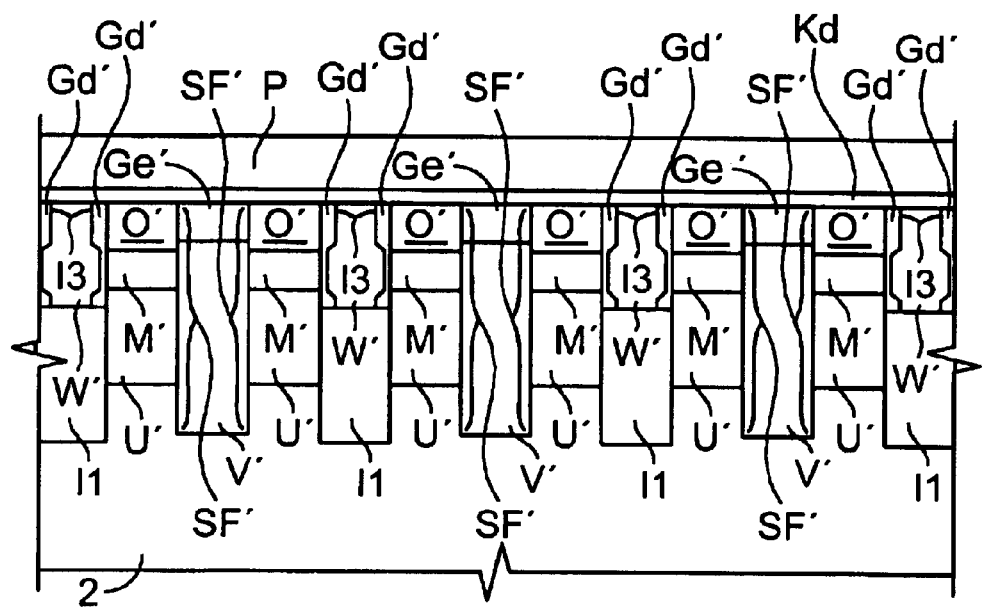
FIG. 7a shows the cross section of FIG. 6a after isolating structures, a gate dielectric, word lines, a capacitor dielectric and a capacitor electrode have been produced.
Figure 7B:
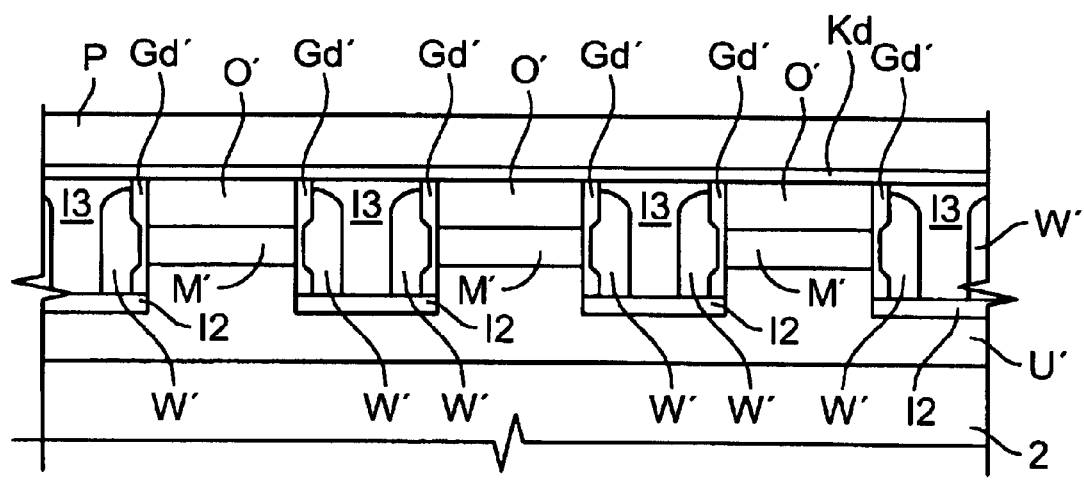

A gate dielectric Gd' about 5 nm thick is produced by thermal oxidation (see FIGS. 7a and 7b).

In order to produce word lines W', in-situ, n-doped polysilicon is deposited in a thickness of about 80 nm and etched back about 150 nm deep. This produces the word lines W' in a self-adjusted manner in the form of mutually adjacent gate electrodes, which surround pairs of sequences of layers SAF' annularly. Parts of the word lines W' which are located in the second dividing trenches T2 are spacer-like (see FIG. 7b).

Two mutually adjacent sequences of layers SAF' which are separated from each other by one of the connecting structures V' form a pair which is part of a transistor. The parts of the lower layer U' belonging to the pair can be used as a first source/drain region of the transistor. The parts of the central layer M' belonging to the pair can be used as channel regions of the transistor. The parts of the upper layer O' belonging to the pair and the doped regions Ge' are suitable as a second source/drain region of the transistor. The connecting structures V' connect the channel regions of the transistors to the substrate 2, which prevents floating-body effects.

A third insulating structure I3 is subsequently produced by SiO$_2$ being deposited in a thickness of about 300 nm and planarized by chemical mechanical polishing until the upper layer O' is exposed (see FIGS. 7a and 7b). Barium strontium titanate is then applied in a thickness of about 20 nm, which forms a capacitor dielectric Kd. The second source/drain regions of the transistors act at the same time as first capacitor electrodes of capacitors.

In order to produce a second capacitor electrode P which is common to all the capacitors, in-situ n-doped polysilicon is deposited in a thickness of about 200 nm (see FIGS. 7a and 7b).

The circuit arrangement produced is a DRAM cell arrangement, in which a memory cell comprises one of the transistors and one of the capacitors, which are connected in series. Transistors arranged between mutually adjacent first dividing trenches T1 have first source/drain regions which are joined to with each other and form bit lines. The bit lines are divided in two, so that the aforesaid transistors are connected to two bit lines which are separated from each other but which are connected together in a periphery of the DRAM cell arrangement. The memory cell has an area of 4F$^2$.

Many variations of the exemplary embodiments, which likewise lie within the scope of the invention, are conceivable. For example, dimensions of the layers, structures and trenches can be matched to the respective requirements.

The capacitor dielectric can also consist of a different material or comprise a number of layers, for example in the form of an ONO sequence of layers.

The connecting structures can also be produced by filling the trenches with in-situ doped polysilicon.

During the production of the connecting structures, the dopant concentration can be increased continuously or discontinuously, so that inner parts of the connecting structures are more highly doped than outer parts.

In the case of the DRAM cell arrangement, the doped regions can be left out. Each transistor comprises a sequence of layers. The bit lines are operated as individual bit lines and not connected together in pairs in the periphery. In this case, a memory cell has an area of only 2F$^2$.

What is claimed is:

1. A method of producing an integrated circuit having at least one vertical MOS transistor, said method comprising:
   doping a substrate with a first conductivity type to form a layer adjacent to a surface of the substrate;
   forming a first source/drain region of the transistor by doping a lower layer with a second conductivity type to form a lower doped layer;
   forming a channel region of the transistor by doping a central layer with the first conductivity type, the central layer being disposed above the lower layer; and
   forming a second source/drain region of the transistor by doping an upper layer with the second conductivity type, the upper layer being disposed above the central layer, the upper layer, the central layer and the lower layer being structured to form a sequence of layers having a first face and a second face opposite the first face,
      forming a trench that cuts through the upper layer, the central layer and the lower layer, so that the sequence of layers and a further sequence of layers constructed in a manner analogous thereto are produced,
      filling the trench with material doped with the first conductivity type, thereby forming, on the first face of the sequence of layers, a connecting structure for providing electrical connection between the channel region and the substrate, the connecting structure being doped with the first conductivity type, and adjoining the first face of the sequence of layers and a first face of the further sequence of layers, and laterally adjoining at least the central layer and the lower layer, and extending into the substrate,
   forming a gate dielectric and, adjacent thereto, a gate electrode disposed at least on the second face of the sequence of layers,
   forming a plurality of memory cells, each of said memory cells including a sequence of layers and a further sequence of layers,
   forming the trenches, in which the connecting structures belonging to the memory cells are formed, in the form of strips,
   forming a plurality of first dividing trenches parallel to the trenches, so that alternately one of the memory cells and one of the first dividing trenches are arranged beside each other,
   forming at least parts of the gate electrodes in the first dividing trenches,
   forming lower bit lines from the lower layer by structuring the lower layer so that the lower bit lines adjoin the connecting structures and run parallel to the connecting structures, and
   forming word lines extending transversely with respect to the lower bit lines, the word lines thus formed being connected to the gate electrodes.

2. The method of claim 1, further comprising:
   forming, above the connecting structure, a doped region doped with a second conductivity type opposite to the first conductivity type, the region thus formed adjoining the upper layer.

3. The method of claim 1, wherein forming said plurality of first dividing trenches comprises
   extending said first dividing trenches part way into the lower layer,
   wherein forming the lower bit lines from the lower layer comprises producing the trenches so that alternately one of the lower bit lines and one of the trenches are arranged beside each other,
   and further comprising forming doped regions after the formation of the first dividing trenches by doping upper parts of the connecting structures so that the upper parts are converted into the doped regions.

4. The method of claim 1,
   wherein forming the first dividing trenches comprises cutting through the lower layer,
   in which forming the lower bit lines from the lower layer comprises producing the trenches and the first dividing trenches so that one of the lower bit lines is arranged between one of the trenches and one of the first dividing trenches,
   further comprising forming second dividing trenches transversely with respect to the first dividing trenches, and extending part way into the lower layer,
   in which forming the word lines comprises producing mutually adjacent gate electrodes that surround the sequences of layers annularly at the faces thereof,
   further comprising forming a capacitor dielectric above the first layer, the capacitor dielectric being usable as first capacitor electrodes of capacitors, and forming a second capacitor electrode above the capacitor dielectric.

5. The method of claim 1, further comprising forming a first auxiliary layer on the upper layer and forming, on the first auxiliary layer, a second auxiliary layer, the first auxiliary layer and the second auxiliary layer being strip-like layers, so that the upper layer is partially exposed, forming spacers by depositing and etching back material, the spacers adjoining the first auxiliary layer and the second auxiliary layer, forming the trenches by masking with the spacers and the second auxiliary layer, following the production of the connecting structures, depositing auxiliary structures above the connecting structures, exposing and removing the first auxiliary layer, and forming the first dividing trenches by masking with the spacers and the auxiliary structures.

6. The method of claim 4, further comprising forming, following the removal of the first auxiliary layer, further spacers adjacent to the spacers, forming the first dividing trenches by masking with the spacers, the further spacers and the auxiliary structures, the first dividing trenches having widths smaller than widths of the second dividing trenches, forming the word lines by depositing and etching back material to such a thickness that the word lines form mutually adjacent gate electrodes without a mask.

7. The method as claimed in claim 1, wherein forming the connecting structures comprises forming the connecting structures by epitaxy.

8. The method of claim 1, wherein forming the connecting structures comprises depositing polycrystalline semiconductor material.

9. The method of claim 7, wherein forming the connecting structures comprises increasing a dopant concentration so that inner parts of the connecting structures are more highly doped than outer parts of the connecting structures.

10. A method of producing an integrated circuit having at least one vertical MOS transistor, said method comprising:

doping a substrate with a first conductivity type to form a layer adjacent to a surface of the substrate;

forming a first source/drain region of the transistor by doping a lower layer with a second conductivity type to form a lower doped layer;

forming a channel region of the transistor by doping a central layer with the first conductivity type, the central layer being disposed above the lower layer; and forming a second source/drain region of the transistor by doping an upper layer with the second conductivity type, the upper layer being disposed above the central layer, the upper layer, the central layer and the lower layer being structured to form a sequence of layers having a first face and a second face opposite the first face, forming, on the first face of the sequence of layers, a homogeneous connecting structure for providing electrical connection between the channel region and the substrate, the connecting structure being doped with the first conductivity type, laterally adjoining at least the central layer and the lower layer, and extending into the substrate, forming a gate dielectric and, adjacent thereto, a gate electrode disposed at least on the second face of the sequence of layers.

* * * * *